US006188581B1

(12) United States Patent
Daoud

(10) Patent No.: US 6,188,581 B1
(45) Date of Patent: Feb. 13, 2001

(54) EXPANDABLE HOUSING FOR PLUG-IN PROTECTORS

(75) Inventor: Bassel Hage Daoud, Parsippany, NJ (US)

(73) Assignee: Avaya Technology Corp., Miami Lakes, FL (US)

( * ) Notice: Under 35 U.S.C. 154(b), the term of this patent shall be extended for 0 days.

(21) Appl. No.: 09/229,293

(22) Filed: Jan. 13, 1999

(51) Int. Cl.[7] .......... H05K 5/00

(52) U.S. Cl. .......... 361/752; 361/753; 361/801; 439/519; 206/706; 220/4.02

(58) Field of Search .......... 361/752, 753, 361/759, 801, 802, 808, 809; 439/124, 519, 936; 379/429, 412, 440; 206/706; 220/4.02

(56) References Cited

U.S. PATENT DOCUMENTS 4,215,381 * 7/1980 Heisinger .......... 361/124
5,359,657 * 10/1994 Pelegris .......... 379/412
5,754,643 * 5/1998 Decker et al. .......... 379/399

* cited by examiner

*Primary Examiner*—Jayprakash N. Gandhi
(74) *Attorney, Agent, or Firm*—Howard C. Miskin; Gloria Tsui-Yip

(57) ABSTRACT

An expandable housing for plug-in protectors for accommodating printed wiring board of varying length. The improved housing comprises a shell unit and a base unit. Both the shell and base units have a hollow longitudinally extending body with an opening at the front and rear portions, respectively. On at least one of the inner sidewalls in the cavity of the body of the shell unit is a first set of teeth running horizontally to the longitudinal axis of the body. On at least one of the outer sidewalls on the body of the base unit is a corresponding second set of teeth running horizontally to the longitudinal axis of the body. The cavity of the base unit supports and receives a portion of a printed wiring board containing surge protective devices, which is connected to pins extending from the front portion of the body of the base unit. The body of the base unit, with the printed wiring board extending from the rear portion, advantageously fit within the cavity of the shell unit with the first set of teeth engaging and interlocking the second set of teeth to form the expandable housing unit. The overall length of the housing is variable depending on the extent base unit with the printed wiring board extending therefrom fits within the cavity of the shell unit.

10 Claims, 9 Drawing Sheets

EXPANDABLE HOUSING FOR PLUG-IN PROTECTORS

FIELD OF THE INVENTION

The invention relates to an improved housing for plug-in protectors that is expandable to accommodate different size components contained in the protectors.

BACKGROUND OF THE INVENTION

A building entrance protector, i.e. junction box, provides an interface for cables from the central office of the service provider for distribution to subscribers throughout the building served by the junction box. A typical building entrance protector contains a protector field, which provides surge protection to each subscriber's line. Advantageously, the protector field comprises a panel having sockets thereon for plug-in protectors, which are solid state devices mounted on printed wiring board. A typical protector field has a five by five configuration. Due the need to conserve space within a junction box, the twenty-five plug-in protectors are placed abutting each other on the panel.

A plug-in protector has five terminals. A typical five-pin plug-in protector has a rectangular box shape housing measuring ½ inch wide, ¾ inch high and 1⅝ inch long. The housing of a prior art plug-in protector comprises a shell unit and a base unit. The shell unit has a hollow rectangular box shape body with an opening at the front portion. The rear portion of the body has an integral handle. Extending from the rear portion of the base unit is a printed wiring board containing surge protective devices. Connected to the printed wiring board and extending from the front portion of the base unit are pins for plugging into a protective field panel in a junction box for connection to and protection of a subscriber's line.

The rear portion of the base unit is inserted into the cavity of the shell unit, thereby enclosing the cavity opening, with the printed wiring board housed within the cavity of the shell unit. The base unit provides latches for engaging corresponding latch holes on the shell unit to maintain the unity of the shell and base units of the surge protector.

The size of the housing for plug-in protectors vary depending on the application and the type of components contained on the printed wiring board. Due to the limited space on a protector field panel, the only variable for expansion is the length. For prior art plug-in protectors, a larger sized printed wiring board requires a longer shell unit to accommodate the increase in length.

Therefore, there is a need for an improved housing for plug-in protectors that is easily expandable to accommodate different size of printed wiring board housed within the protectors.

SUMMARY OF THE INVENTION

The invention provides an improved housing for accommodating different sized printed wiring board housed within a plug-in protector.

The improved housing of the plug-in protector is expandable lengthwise to accommodate printed wiring board of varying length.

The housing of this invention comprises a shell unit and a base unit. The shell unit has a hollow rectangular box shape body with an opening at the front portion. The rear portion of the body has an integral handle. On each of the four inner sidewalls in the cavity of the body is a first set of teeth, ribs or grooves running horizontally to the axis from the front to the rear portions of the body.

The base unit has a hollow rectangular box shape body with an opening at the rear portion. The cavity of the base unit provides a pair of ledges extending from opposite inner sidewalls for supporting and receiving at least a portion of a printed wiring board containing surge protective devices. The printed wiring board is connected to pins extending from the front portion of the body of the base unit. The body of the base unit is dimensioned to advantageously fit within the cavity of the shell unit. On each of the four outer sidewalls of the body of the base unit is a second set of teeth, ribs or grooves running horizontally to the axis from the front to the rear portions of the body and mateable or engageable with corresponding teeth, ribs or grooves on the inner sidewalls of the cavity of the shell unit.

The rear portion of the base unit, with the printed wiring board inserted into its cavity and extending from said rear portion, is inserted fully into the cavity of the shell unit, thereby enclosing the cavity opening of the shell unit with the first set of teeth in the inner sidewalls of the shell unit engaging the corresponding second set of teeth on the outer sidewalls of the base unit. The two sets of teeth overlap and interlock to enclose the electrical components on the printed wiring board from environmental elements.

The cooperative shell and base units of the present invention is an expandable housing that can accommodate different lengths printed wiring board. A shorter printed wiring board allows a plurality of teeth of the first and second sets to overlap when the base unit is fully inserted into the cavity of the shell unit. A longer printed wiring board can be used so long as the two sets of teeth on the shell and base units matingly overlap to enclose the cavity opening of the shell unit.

It will be appreciated that, for purposes of illustration, these figures are not necessarily drawn to scale.

DETAILED DESCRIPTION OF THE PREFERRED EMBODIMENTS

Figure 1A:
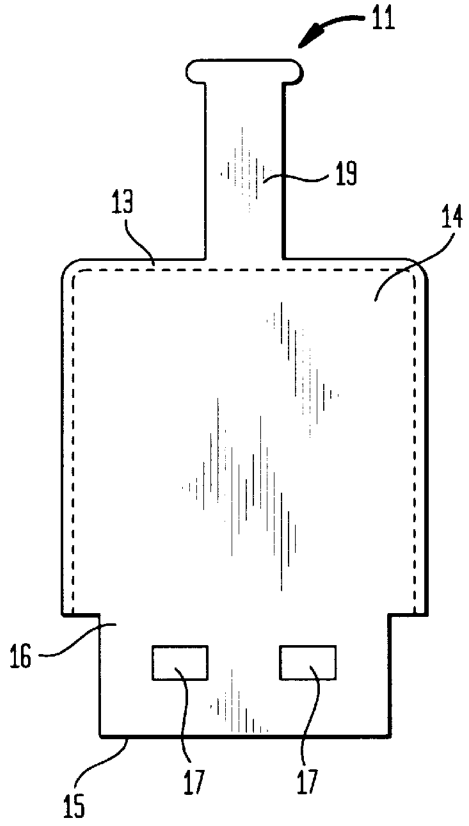
FIG. 1A (PRIOR ART)
FIGS. 1A and 1B are, respectively, a top plan view and a side view of a shell unit of a prior art plug-in protector housing.
Figure 1B:
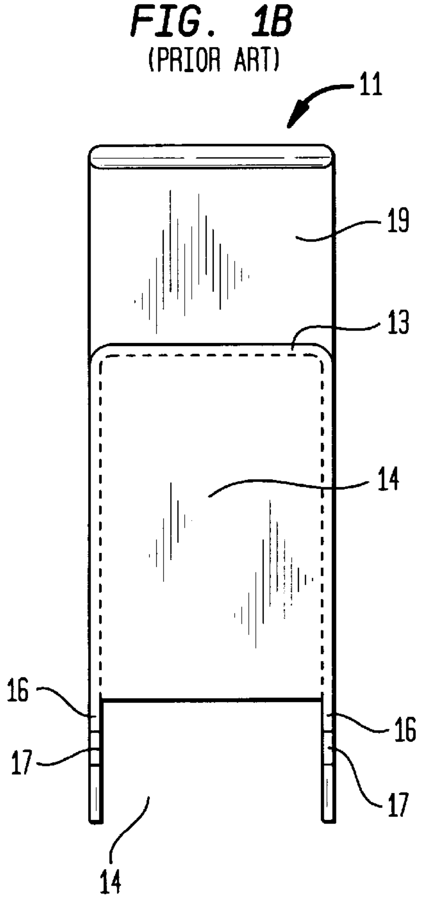
FIG. 1B (PRIOR ART)
Figure 2:
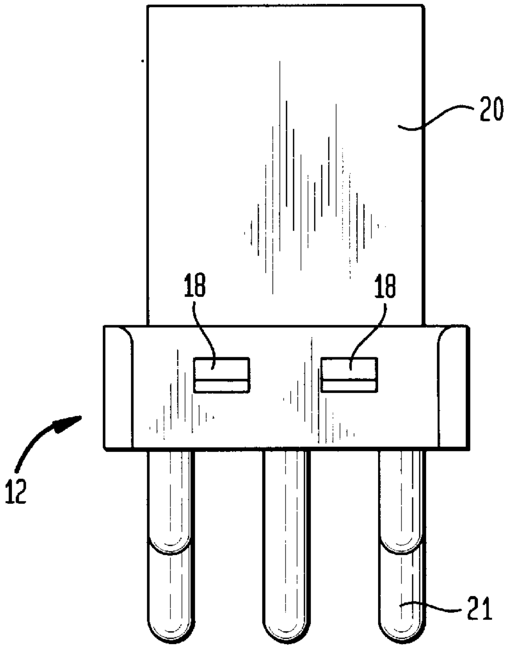
FIG. 2 (PRIOR ART)
FIG. 2 is top plan view of a base unit of a prior art plug-in protector housing with a printed wiring board and five terminals extending therefrom.

With reference to the drawings, wherein the same reference number indicates the same element throughout, there is shown in FIGS. 1A and 1B, respectively, a top plan view and a side view of a shell unit 11 and in FIG. 2 a top plan view of a base unit 12 of a prior art plug-in protector housing 10.

Figure 3A:
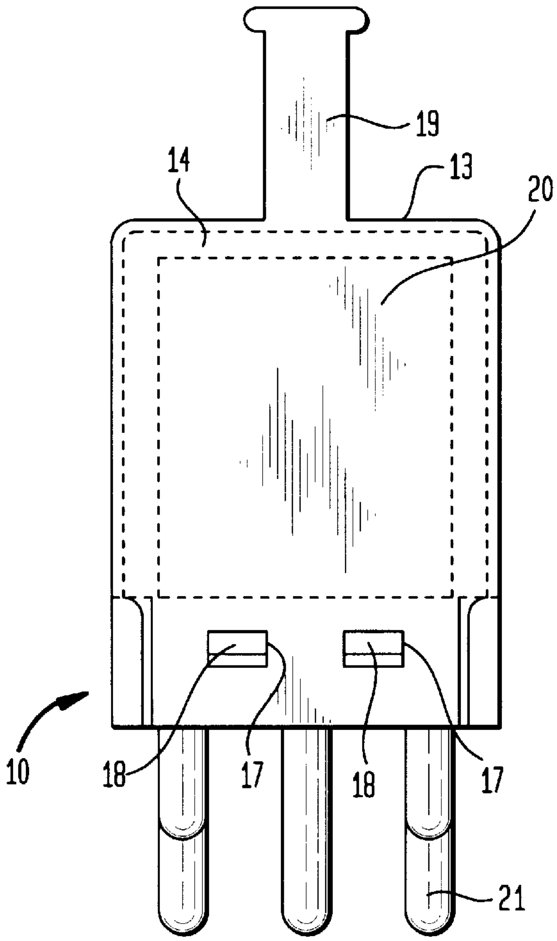
FIG. 3A (PRIOR ART)
FIGS. 3A and 3B are, respectively, a top plan view and a side view of the combination of the shell unit of FIG. 1 and base unit of FIG. 2 to form a prior art plug-in protector housing.
Figure 3B:
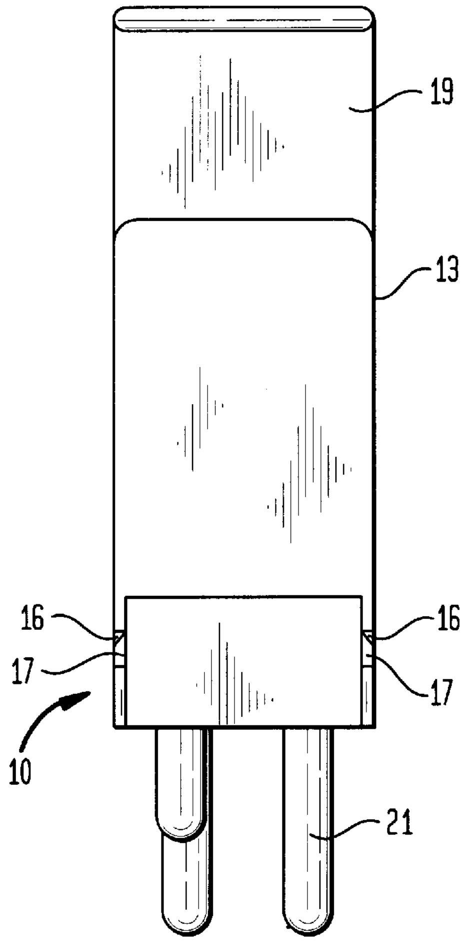
FIG. 3B (PRIOR ART)

As shown in FIGS. 1A and 1B, the prior art shell unit 11 has a hollow rectangular box shape body 13 with a cavity 14 and opening 15 at the front portion. On the sidewalls 16 of body 13, at the front portion, are two pairs of latch holes 17 for engaging corresponding latch elements 18 (see FIG. 2) on the base unit 12 to form prior art housing 10, as shown in FIGS. 3A and 3B. Extending from the rear portion of body 13 is an integral handle 19.

As shown in FIG. 2, extending from the rear portion of the base unit 12 is a printed wiring board 20 containing surge protective devices. Connected to printed wiring board 20 (not shown) and extending from the front portion of base unit 12 are pins 21 for plugging into a protective field panel in a junction box for connection to and protection of a subscriber's line.

To form prior art housing 10, rear portion of base unit 12 with the printed wiring board 20 extending therefrom is inserted into the cavity 14 through opening 15 of shell unit 11. When assembled, base unit 12 encloses opening 15 of shell unit 11 and thereby enclosing printed wiring board 20, as shown in FIGS. 3A and 3B. The two pairs of latch elements 18 on the base unit 12 engage the corresponding latch holes 17 on the shell unit 11 to maintain the unit of the prior art housing 10.

As shown in FIG. 3A, prior art housing 10 cannot accommodate a printed wiring board that is longer than the length of cavity 14 of shell unit 11. A different shell unit must be used to accommodate printed wiring board longer than the shell unit 11.

Figure 4:
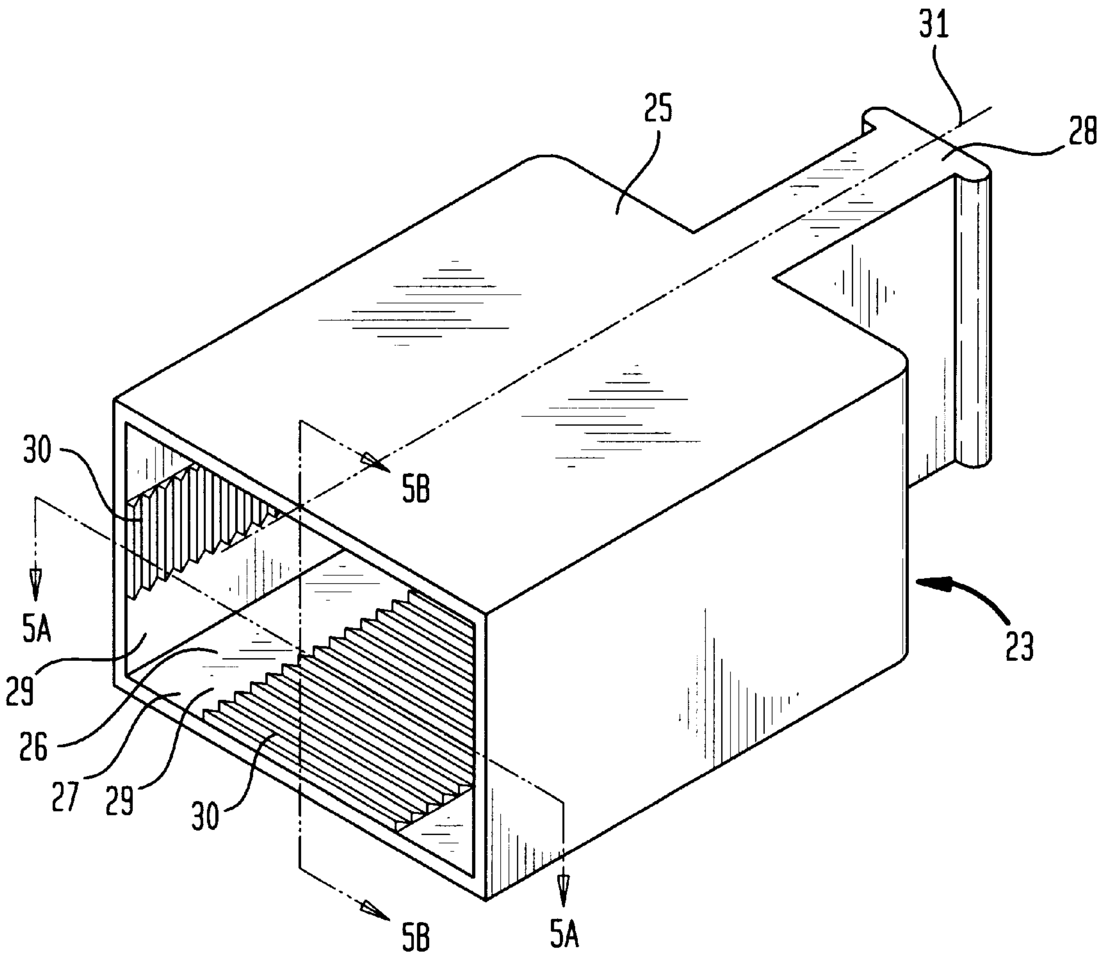
FIG. 4 is a perspective view of the shell unit of the present invention, illustrating the hollow body having a cavity opening at the front portion.
Figure 5A:
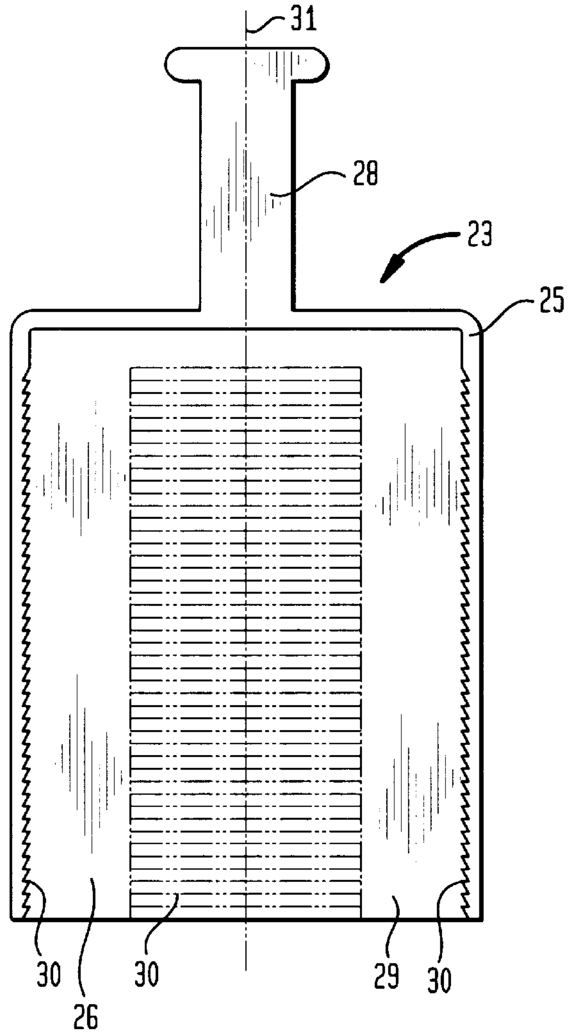
FIGS. 5A and 5B are cross-sectional views taken, respectively, along line 5A—5A and line 5B—5B in FIG. 4, illustrating the plurality of teeth on the four inner sidewalls.
Figure 5B:
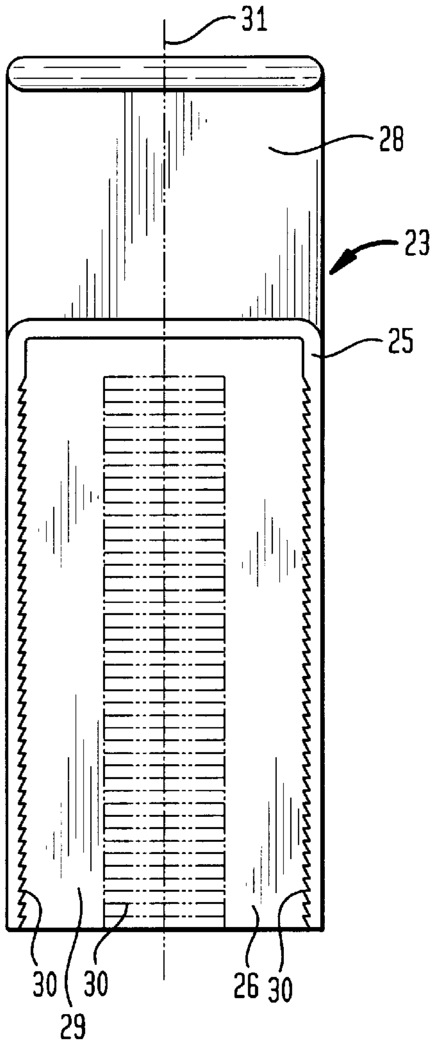
Figure 7:
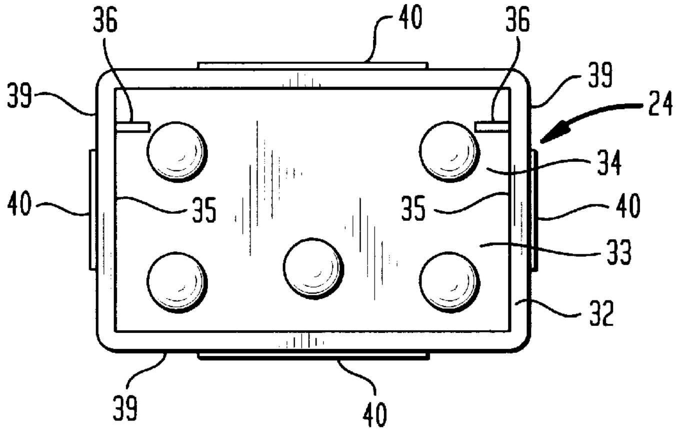
FIG. 7 is a rear view of the base unit illustrating the hollow body with a cavity opening at the rear portion and a pair of ledges extending from the inner sidewalls for supporting and receiving a printed wiring board.
Figures 6A, 6B:
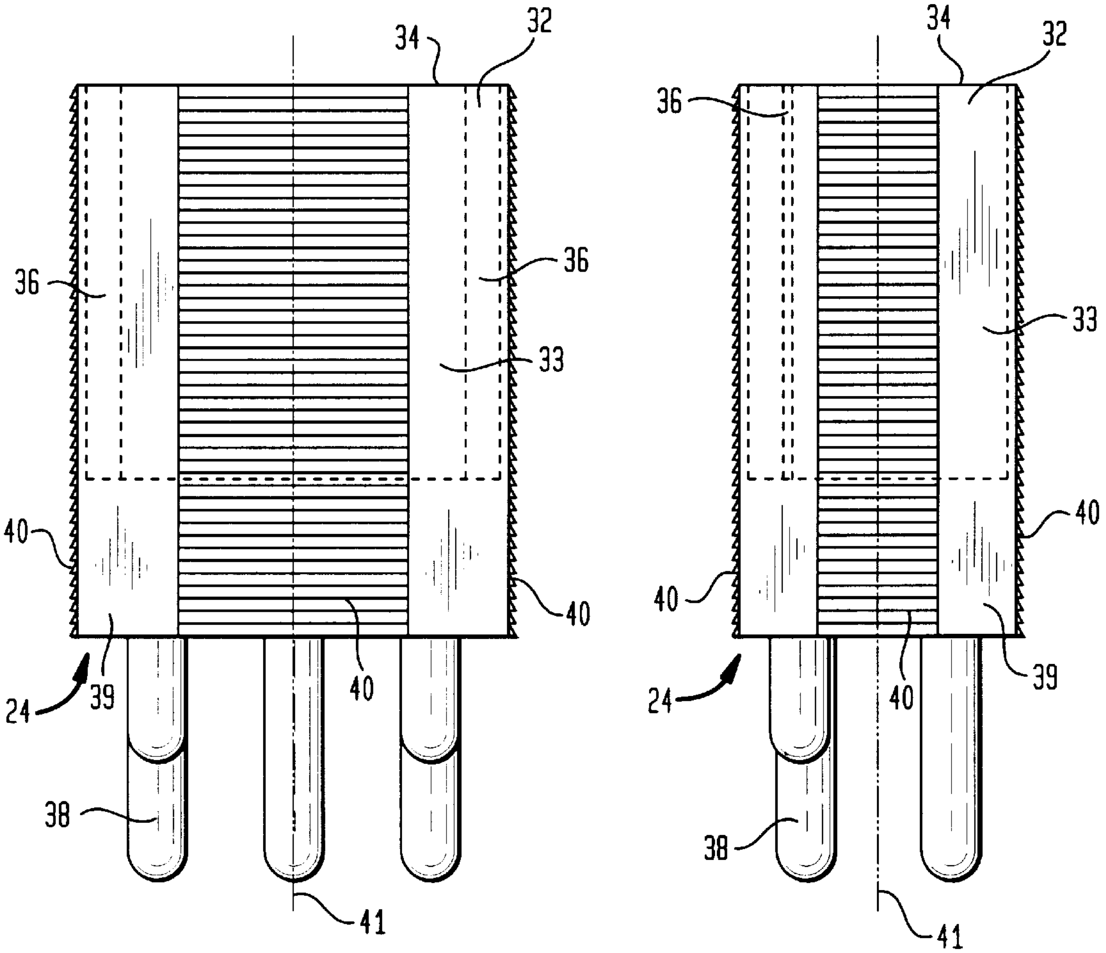
FIGS. 6A and 6B are, respectively, a top plan view and a side view of the base unit of the present invention, illustrating the plurality of teeth on the four outer sidewalls.

The improved housing 22 of the present invention comprises of a shell unit 23 as shown in FIGS. 4, 5A and 5B and a base unit 24 as shown in FIGS. 6A, 6B and 7. As shown in FIG. 4, shell unit 23 has a hollow rectangular box shape body 25 with a cavity 26 and an opening 27 at the front portion. The rear portion of the body 25 has an integral handle 28. On each of the four inner sidewalls 29 in the cavity 26 of shell unit 23 is a first set of teeth 30 running horizontally to the longitudinal axis 31 (best shown in (FIGS. 5A and 5B). While teeth are illustrated, ribs or grooves may also be used.

Figure 8A:
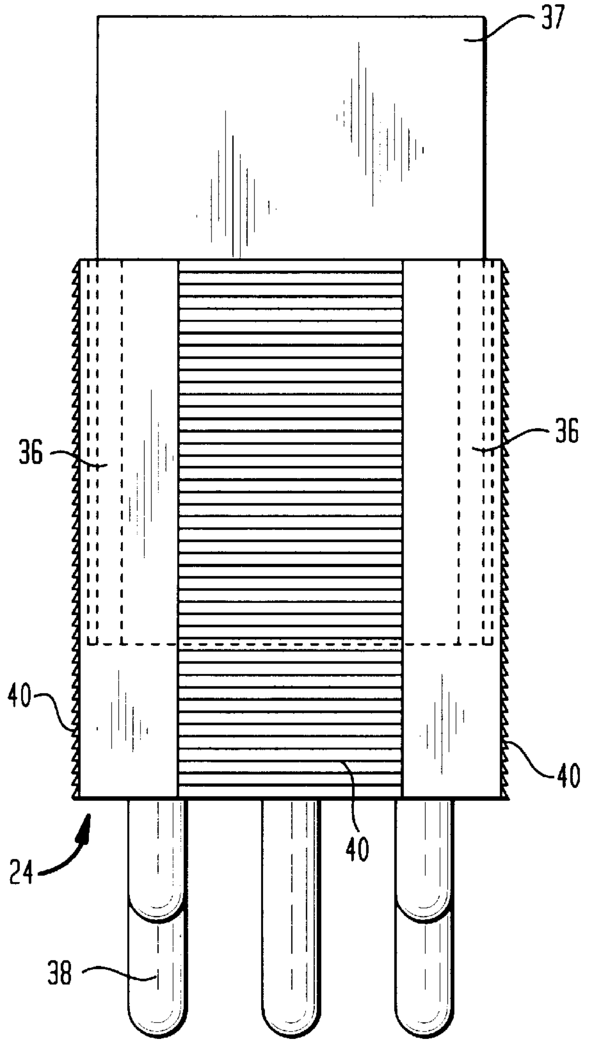
FIGS. 8A and 8B are, respectively, a top plan view and a side view of the base unit of the present invention having a portion of a printed wiring board received in the cavity and supported by the pair of ledges.
Figure 8B:
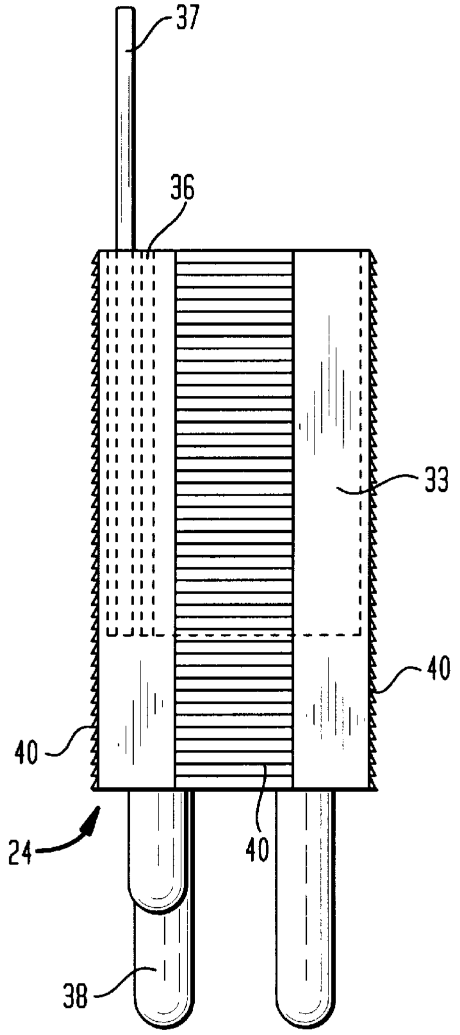

As shown in FIG. 7, base unit 24 of the present invention comprises a hollow rectangular box shape body 32 with a cavity 33 and an opening 34 at the rear portion. Extending from two inner opposite sidewalls 35 in cavity 33 is a pair of ledges 36 for supporting and slidably receiving a printed wiring board 37 containing surge protective devices as shown in FIGS. 8A & 8B. Printed wiring board 37 is connected (not shown) to five pins 38 extending from the front portion of the body 32 of base unit 24. On each of the four outer sidewalls 39 of the body 32 of base unit 24 is a second set of teeth, ribs or grooves 40 running horizontally to the longitudinal axis 41 (best shown in FIGS. 6A and 6B). Body 32 of base unit 24 is dimensioned to fit into cavity 26 of shell unit 23 with the first set of teeth 30 inside cavity 26 of shell unit 23 engaging the second set of teeth 40 on the base unit 24 (as shown in FIG. 10).

Figure 9:
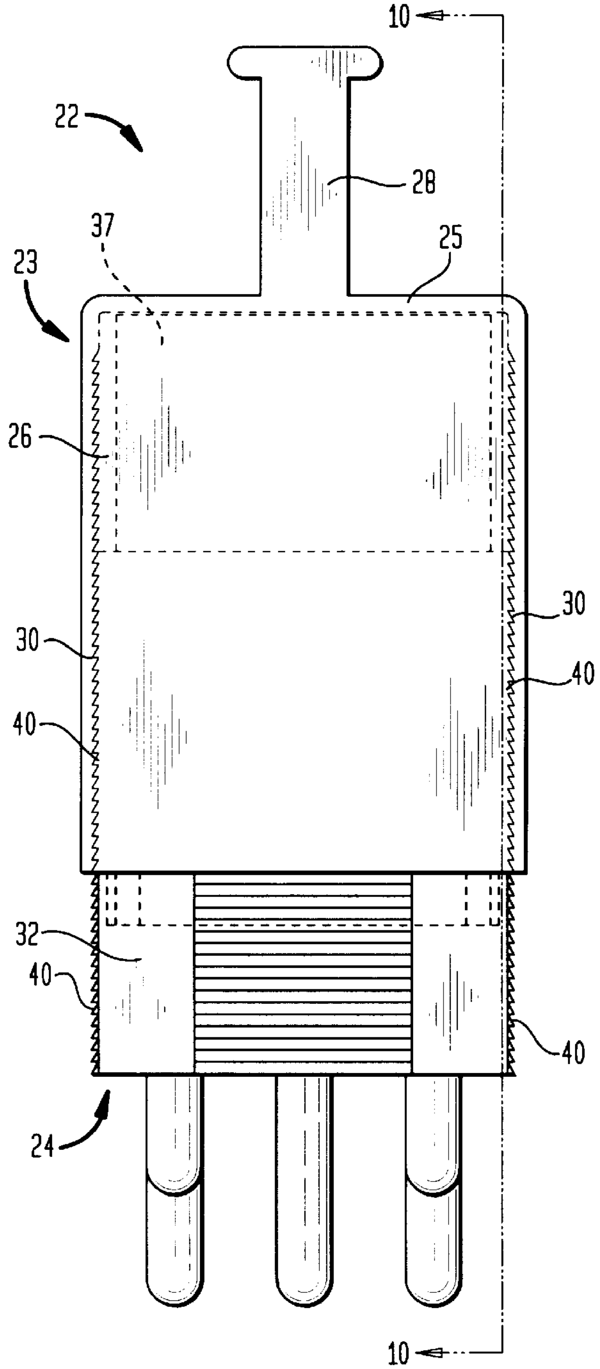
FIG. 9 is a top plan view of the combination of the shell unit and base unit of the present invention to form a plug-in protector housing, illustrating the interlocking of the plurality of teeth and the enclosure of the printed wiring board in the cavity of the shell unit.
Figure 10:
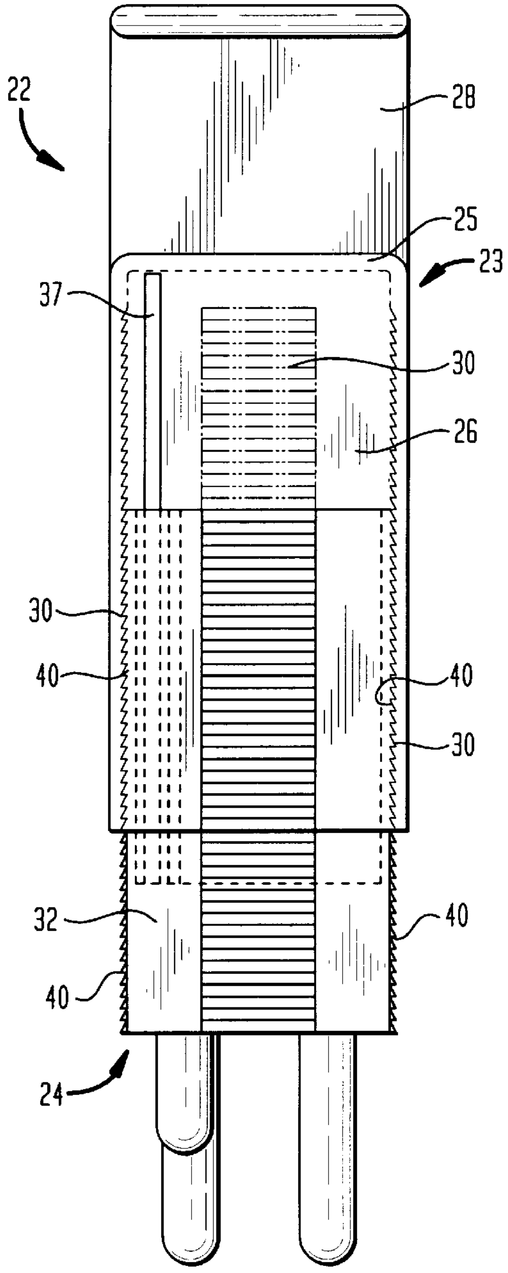
FIG. 10 is a cross-sectional view taken along line 10—10 in FIG. 9.
Figure 11A:
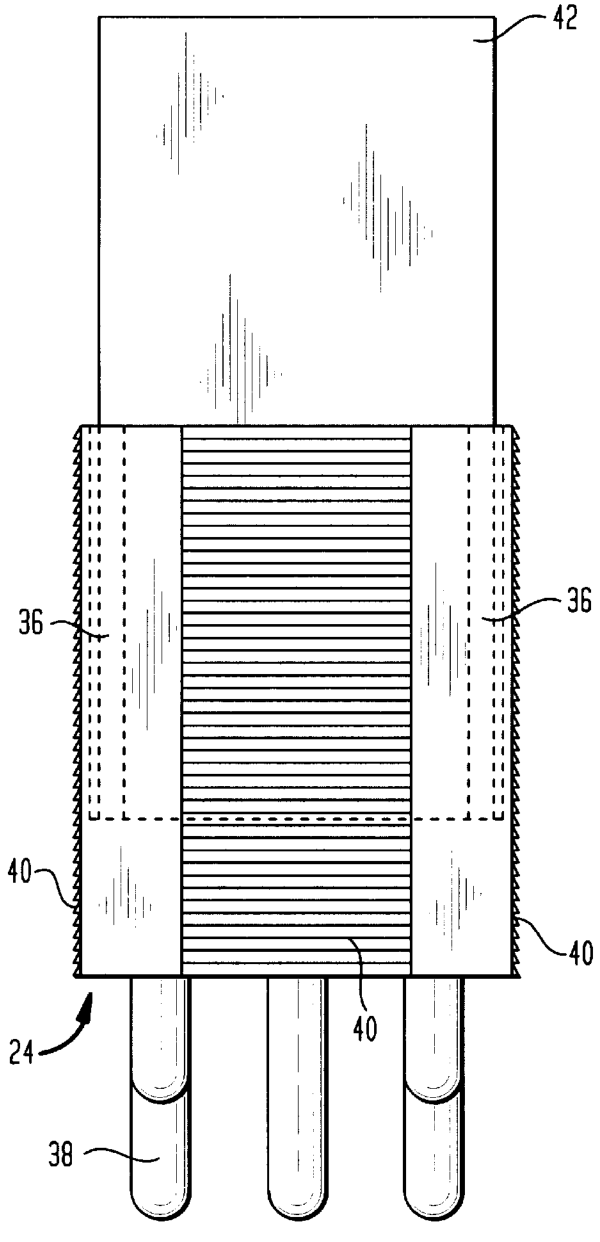
FIG. 11A and 11B are, respectively, a top plan view and a side view of the base unit of the present invention having a portion of a printed wiring board longer than that shown in FIG. 8A received in the cavity and supported by the pair of ledges.
Figure 11B:
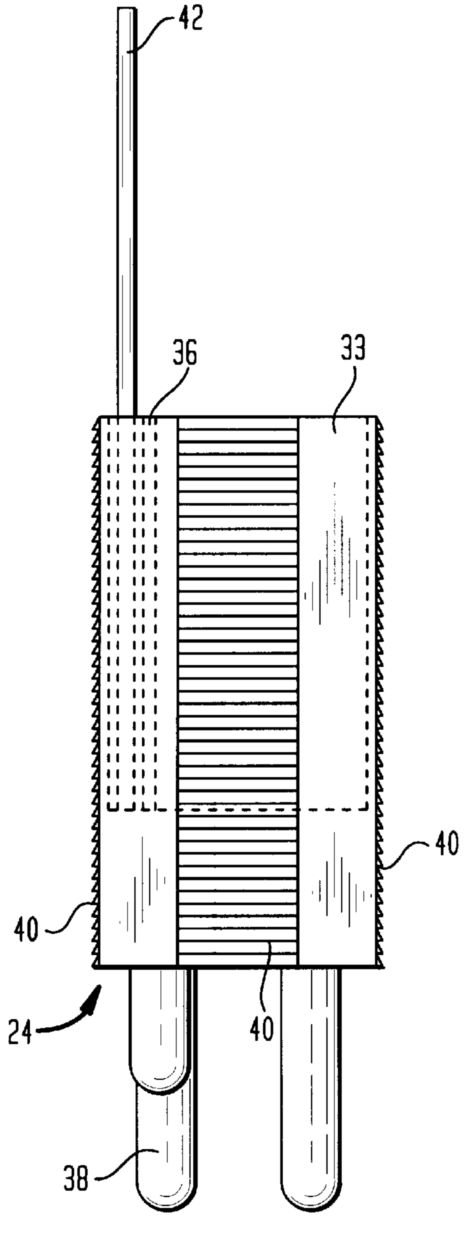

To form improved housing 22 of the present invention, the rear portion of base unit 24 with printed wiring board 37 extending therefrom (shown in FIGS. 8A and 8B) is inserted into cavity 26 through opening 27 of the shell unit 23, with the first set of teeth 30 engaging and interlocking with the overlapped portion of the second set of teeth 40 as shown in FIGS. 9 and 10. As shown in FIGS. 5A, 5B, 6A and 6B, it is preferable that the first set of teeth 30 are angled towards the rear portion of the shell unit and the second set of teeth 40 are angled towards the front portion of the base unit to facilitate the insertion of base unit 24 into opening 27 of shell unit 23 and, at the same time, resist the withdrawal of base unit 24 from cavity 26 of shell unit 23.

Base unit 24 encloses opening 27 of cavity 26 of shell unit 23 with printed wiring board 37 fully inserted to the extent cavity 26 of shell unit 23 allows to provide a compact housing 22. When the shell unit 23 and base unit 24 are assembled and joined, printed wiring board 37 is enclosed within housing 22 from external elements such as humidity and dust.

Figure 12:
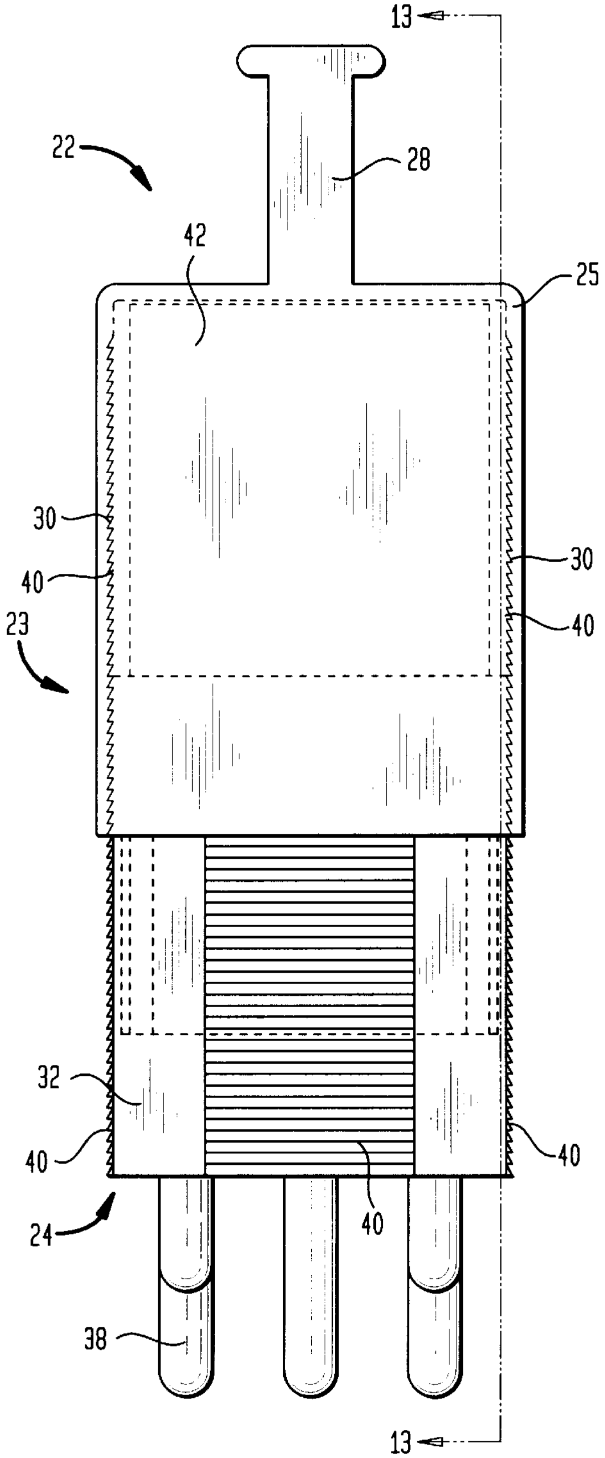
FIG. 12 is a top plan view of the combination of the shell unit and base unit of the present invention to form a plug-in protector housing, illustrating the interlocking of the plurality of teeth and the enclosure of the printed wiring board shown in FIG. 11A in the cavity of the shell unit.
Figure 13:
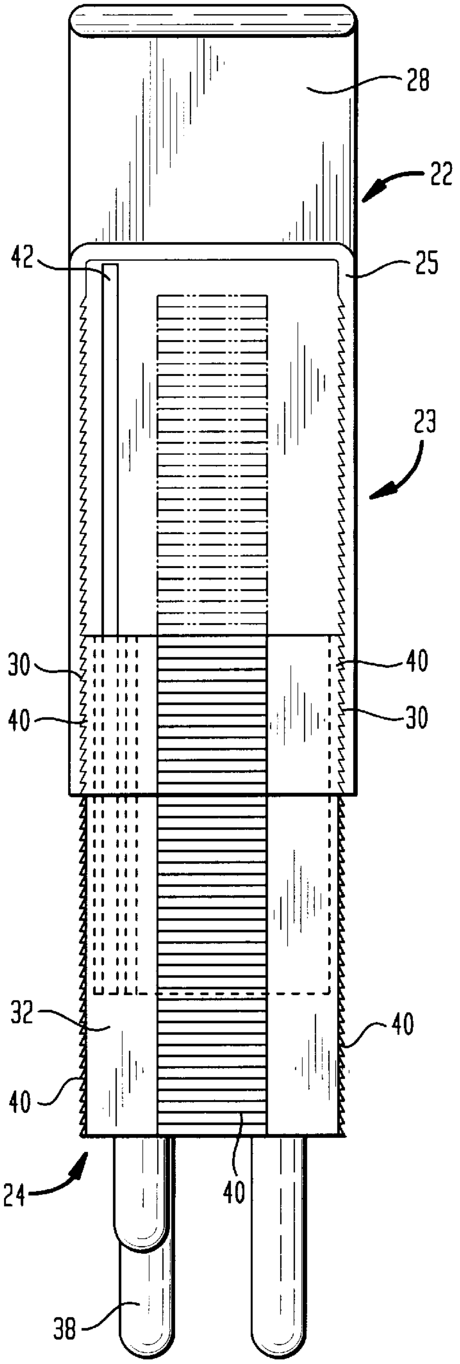
FIG. 13 is a cross-sectional view taken along line 13—13 in FIG. 12.

As shown in FIGS. 11A, 11B, 12 and 13, housing 22 of the present invention can accommodate a printed wiring board 42 longer than printed wiring board 37 shown in FIGS. 8A and 8B. The pair of ledges 36 on the two inner opposite sidewalls 35 in cavity 33 of base unit 24 supports and slidably accepts printed wiring boards of varying length. When base unit 24 with printed wiring board 42 is inserted into cavity 26 through opening 27 of the shell unit 23, the first set of teeth 30 engages and interlocks the second set of teeth 40 as shown in FIGS. 12 and 13, with less overlapping than the that shown in FIGS. 9 and 10 due to the longer printed wiring board 42 and resulting in an expanded housing 22.

The improved housing 22 can accommodate lengths of the printed wiring boards slightly less than the total the longitudinal extent of the cavity 26 of shell unit 23 and the cavity 33 of base unit 24 such that a couple of teeth from the first set of teeth 30 and second set of teeth 40 can overlap and interlock to maintain the shell unit 23 and base unit 24 as one single housing 22.

Although the first and second sets of teeth 30 and 40, respectively, are shown in the drawings to cover only a portion of the sidewalls, each set of teeth can extend horizontally to cover an entire sidewall.

Although the shape of the improved housing 22 is shown in the drawings as having a rectangular box shape, other shapes such as cylindrical or triangular can be substituted without detracting from the spirit of the invention.

Although certain features of the invention have been illustrated and described herein, other better modifications and changes will occur to those skilled in the art. It is, therefore, to be understood that the appended claims are intended to cover all such modification and changes that fall within the spirit of the invention.

What I claim is:

1. An expandable housing for protectors containing printed wiring boards comprising:

a shell unit comprising a longitudinally extending hollow body having front and rear portions and defining a cavity, said front portion having an opening communicating with said cavity; and a base unit comprising a longitudinally extending hollow body having front and rear portions and defining a cavity, said rear portion of said base unit having an opening communicating with said cavity of said base unit for receiving the printed wiring board, said body of said base unit being dimensioned to fit snugly inside said cavity of said shell unit whereby said rear portion of said base unit is adjustably insertable into said cavity through said opening in said front portion of said shell unit to form an expandable housing for accommodating different sized printed wiring boards.

2. The housing according to claim 1 wherein said cavity of said base unit further having opposite inner sidewalls and a pair of longitudinally extending ledges extending from said opposite inner sidewalls into said cavity of said base unit for supporting and slidably receiving said printed wiring board.

3. The housing according to claim 1 wherein said printed wiring board extends beyond said cavity of said base unit.

4. The housing according to claim 1 wherein said bodies of said shell unit and said base unit are rectangular box shape.

5. The housing according to claim 4 wherein said cavity of said shell unit further having four inner sidewalls, a first set of teeth on at least one of said inner sidewalls running horizontally to the longitudinal axis of said shell unit to increase friction against said body of said base unit when said base unit is inserted into said cavity of said shell unit.

6. The housing according to claim 5 wherein said body of said base unit further having four outer sidewalls, a second set of teeth on at least one of said outer sidewalls running horizontally to the longitudinal axis of said base unit such that when said base unit is inserted into said cavity of said shell unit, said first set of teeth engages and interlocks with said second set of teeth to form said housing.

7. The housing according to claim 6 wherein said first set of teeth are angled towards the rear portion of said shell unit and said second set of teeth are angled towards the front portion of said base unit to facilitate insertion of said base unit into said cavity of said shell unit and at the same time resist withdrawal of said base unit from said cavity of said shell unit.

8. The housing according to claim 1 wherein said shell unit further having an integral handle extending from said rear portion of said body of said shell unit.

9. The housing according to claim 1 wherein said base unit further having a plurality of pins connected to said printed wiring board and extending from said front portion of said body of said base unit.

10. An expandable housing for plug-in protectors containing printed wiring boards comprising:

a shell unit comprising a longitudinally extending hollow body having front and rear portions and defining a cavity having two or more inner sidewalls, said front portion having an opening to said cavity, and a first set of teeth on at least one of said inner sidewalls running horizontally to the longitudinal axis of said body; and a base unit comprising a longitudinally extending hollow body having front and rear portions and defining a cavity having two or more outer sidewalls, said rear portion of said base unit having an opening to said cavity for receiving said printed wiring board, said body of said base unit being dimensioned to snugly fit inside said cavity of said shell unit, a plurality of pins connected to said printed wiring board and extending from said front portion of said body of said base unit and a second set of teeth on at least one of said outer sidewalls running horizontally to the longitudinal axis of said body of said base unit such that when said rear portion of said base unit is inserted into said cavity through said opening in said front portion of said shell unit, said first set of teeth engages and interlocks with said second set of teeth to form said housing.

* * * * *